United States Patent
Miyoshi

(10) Patent No.: US 9,201,130 B2
(45) Date of Patent: *Dec. 1, 2015

(54) MRI APPARATUS FOR IMAGING BODY FLUIDS BY SUPPRESSING THE BACKGROUND TISSUES

(75) Inventor: Mitsuharu Miyoshi, Tokyo (JP)

(73) Assignee: General Electric Company, Schenectady, NY (US)

(*) Notice: Subject to any disclaimer, the term of this patent is extended or adjusted under 35 U.S.C. 154(b) by 486 days.

This patent is subject to a terminal disclaimer.

(21) Appl. No.: 12/428,286

(22) Filed: Apr. 22, 2009

(65) Prior Publication Data

US 2009/0270719 A1    Oct. 29, 2009

(30) Foreign Application Priority Data

Apr. 23, 2008 (JP) ................. 2008-112872

(51) Int. Cl.
| | |
|---|---|
| *A61B 5/055* | (2006.01) |
| *G01R 33/385* | (2006.01) |
| *G01R 33/563* | (2006.01) |
| *G01R 33/56* | (2006.01) |

(52) U.S. Cl.
CPC ........ *G01R 33/5635* (2013.01); *G01R 33/5602* (2013.01); *G01R 33/5607* (2013.01)

(58) Field of Classification Search
CPC ........... G01R 33/5635; G01R 33/5602; G01R 33/5607
USPC .......... 324/307, 309; 600/407, 410, 413, 419, 600/544
See application file for complete search history.

(56) References Cited

U.S. PATENT DOCUMENTS

| | | | |
|---|---|---|---|
| 4,795,978 A | 1/1989 | Zur et al. | |
| 4,947,837 A | 8/1990 | Sano et al. | |
| 5,035,244 A | 7/1991 | Stokar | |
| 5,115,812 A | 5/1992 | Sano et al. | |
| 5,199,435 A * | 4/1993 | Sugimoto et al. | 600/410 |
| 5,285,158 A | 2/1994 | Mistretta et al. | |
| 5,335,660 A * | 8/1994 | Dumoulin | 600/419 |
| 5,436,562 A | 7/1995 | Dumoulin | |

(Continued)

FOREIGN PATENT DOCUMENTS

JP     2007-190362     8/2007

OTHER PUBLICATIONS

Non-Final Office Action for U.S. Appl. No. 12/392,225 dated Oct. 17, 2012, 14 pages.

*Primary Examiner* — Unsu Jung
*Assistant Examiner* — Serkan Akar

(57) ABSTRACT

An MRI apparatus which images a subject in such that body fluid that flows is emphasized over background tissues, includes a first coil control device that causes a transmission coil and a gradient coil to execute a first pulse sequence for causing longitudinal magnetization components of the background tissues to differ from a longitudinal magnetization component of the body fluid, a second coil control device that causes the transmission coil and the gradient coil to execute a second pulse sequence that inverts the longitudinal magnetization components of the body fluid and the background tissues a plurality of times after the execution of the first pulse sequence, and a third coil control device that causes the transmission coil and the gradient coil to execute a third pulse sequence for acquiring each MR signal of the body fluid after the execution of the second pulse sequence.

18 Claims, 11 Drawing Sheets

(56) References Cited

U.S. PATENT DOCUMENTS

| | | | |
|---|---|---|---|
| 5,655,531 A * | 8/1997 | Nishimura et al. | 600/413 |
| 5,842,989 A * | 12/1998 | Zur | 600/410 |
| 5,860,921 A | 1/1999 | Ma et al. | |
| 6,078,176 A | 6/2000 | McKinnon | |
| 6,230,039 B1 * | 5/2001 | Stuber et al. | 600/410 |
| 6,483,307 B2 * | 11/2002 | Ookawa | 324/309 |
| 6,486,668 B1 | 11/2002 | Ma | |
| 6,587,708 B2 | 7/2003 | Venkatesan et al. | |
| 6,801,800 B2 * | 10/2004 | Miyazaki et al. | 600/410 |
| 6,907,280 B2 * | 6/2005 | Becerra et al. | 600/407 |
| 6,968,225 B2 * | 11/2005 | Vu | 600/410 |
| 7,039,451 B1 | 5/2006 | Jhooti et al. | |
| 7,047,060 B1 * | 5/2006 | Wu | 600/410 |
| 7,209,777 B2 * | 4/2007 | Saranathan et al. | 600/410 |
| 7,383,075 B2 * | 6/2008 | Vu | 600/410 |
| 7,623,901 B2 * | 11/2009 | Kanazawa | 600/413 |
| 7,835,783 B1 * | 11/2010 | Aletras | 600/413 |
| 2002/0032376 A1 * | 3/2002 | Miyazaki et al. | 600/410 |
| 2002/0042563 A1 * | 4/2002 | Becerra et al. | 600/407 |
| 2002/0058867 A1 * | 5/2002 | Breiter et al. | 600/407 |
| 2002/0095085 A1 * | 7/2002 | Saranathan et al. | 600/413 |
| 2004/0049106 A1 * | 3/2004 | Kanazawa | 600/410 |
| 2006/0020198 A1 | 1/2006 | Riederer et al. | |
| 2006/0080044 A1 | 4/2006 | Ropele | |
| 2007/0167733 A1 * | 7/2007 | Miyoshi | 600/410 |
| 2008/0004518 A1 * | 1/2008 | Stehning et al. | 600/410 |
| 2008/0039737 A1 * | 2/2008 | Breiter et al. | 600/544 |
| 2008/0136411 A1 * | 6/2008 | Miyoshi | 324/309 |
| 2009/0062640 A1 * | 3/2009 | Miyoshi | 600/413 |

* cited by examiner

FIG. 8

| TISSUE | T1 VALUE (ms) |
|---|---|
| ARTERY BLOOD | 840 |
| MOISTURE | 2000 |
| MUSCLE | 1000 |
| KIDNEY | 690 |
| LIVER | 580 |
| FAT | 250 |
| INTESTINAL SUBSTANCE | 100~200 |

MRI APPARATUS FOR IMAGING BODY FLUIDS BY SUPPRESSING THE BACKGROUND TISSUES

CROSS REFERENCE TO RELATED APPLICATIONS

This application claims the benefit of Japanese Patent Application No. 2008-112872 filed Apr. 23, 2008, which is hereby incorporated by reference in its entirety.

BACKGROUND OF THE INVENTION

The embodiments described herein relate to an MRI (Magnetic Resonance Imaging) apparatus for imaging body fluid.

As a method for imaging artery blood, there has heretofore been known a method which has paid attention to the fact that a T1 value of artery blood and T1 values of background tissues such as muscles are different from one another (refer to U.S. Pat. No. 5,842,989).

In the '989 patent, longitudinal magnetization is inverted by each inversion pulse, and data about artery blood are acquired when longitudinal magnetization components of background tissues each desired to suppress a signal strength have reached a null point. However, the background tissues include, for example, fat, kidneys, a liver, muscles and intestinal substances (food, moisture, fat, digestive fluid, stool, etc.), and the time intervals required for the longitudinal magnetization components to reach the null point differ according to the type of background tissue. Thus, the method of the '989 patent includes a case in which the background tissues that can be suppressed in signal strength are restricted, and a high-quality blood flow image cannot be obtained.

BRIEF DESCRIPTION OF THE INVENTION

It is desirable that the problem described previously is solved.

In one aspect, an MRI apparatus images a subject in such a manner that body fluid that flows into an imaging area of the subject is emphasized than a plurality of background tissues existing in the imaging area. The MRI apparatus includes a transmission coil for transmitting an RF pulse to the subject; a gradient coil for applying a gradient pulse to the subject; a first coil control device for controlling the transmission coil and the gradient coil in such a manner that a first pulse sequence for causing the values of longitudinal magnetization components of the background tissues to differ from the value of a longitudinal magnetization component of the body fluid is executed; a second coil control device for controlling the transmission coil and the gradient coil in such a manner that a second pulse sequence for inverting the longitudinal magnetization components of the body fluid and the background tissues plural times is executed after the execution of the first pulse sequence; and a third coil control device for controlling the transmission coil and the gradient coil in such a manner that a third pulse sequence for acquiring each MR signal of the body fluid is executed after the execution of the second pulse sequence, wherein the third coil control device controls the transmission coil in such a manner that an excitation pulse is transmitted from the transmission coil while an absolute value of the longitudinal magnetization component of the body fluid that flows through the imaging area is larger than an absolute value of each of the longitudinal magnetization components of the background tissues.

In some embodiments, the first coil control device executes a first pulse sequence thereby to cause the values of longitudinal magnetization components of a plurality of background tissues to differ from the value of a longitudinal magnetization component of body fluid. Thereafter, the second coil control device executes a second pulse sequence thereby to invert the longitudinal magnetization components of the body fluid and the background tissues plural times. With the execution of the second pulse sequence, the longitudinal magnetization components of the background tissues can be attained to a null point at substantially the same time even though TI values of the background tissues are different values.

With the execution of the first pulse sequence, the values of the longitudinal magnetization components of the background tissues become values different from the value of the longitudinal magnetization component of the body fluid. Thus, although the longitudinal magnetization components of the background tissues become values close to the null point at a given time where the second pulse sequence is executed, the longitudinal magnetization component of the body fluid can be set to a value sufficiently separated from the null point. It is thus possible to acquire an image emphasized in body fluid than the background tissues.

Incidentally, each of the background tissues is a concept indicative of a tissue untargeted for imaging.

Additional embodiments will be apparent form the following description of the following exemplary embodiments of the invention as illustrated in the accompanying drawings.

BRIEF DESCRIPTION OF THE DRAWINGS

FIG. 8 illustrates general values of T1 values of body fluid and static tissues contained in the field of view.

DETAILED DESCRIPTION OF THE INVENTION

Embodiments of the invention will hereinafter be explained in detail with reference to the accompanying drawings. Incidentally, the invention is not limited to the embodiments described herein.

Figure 1:
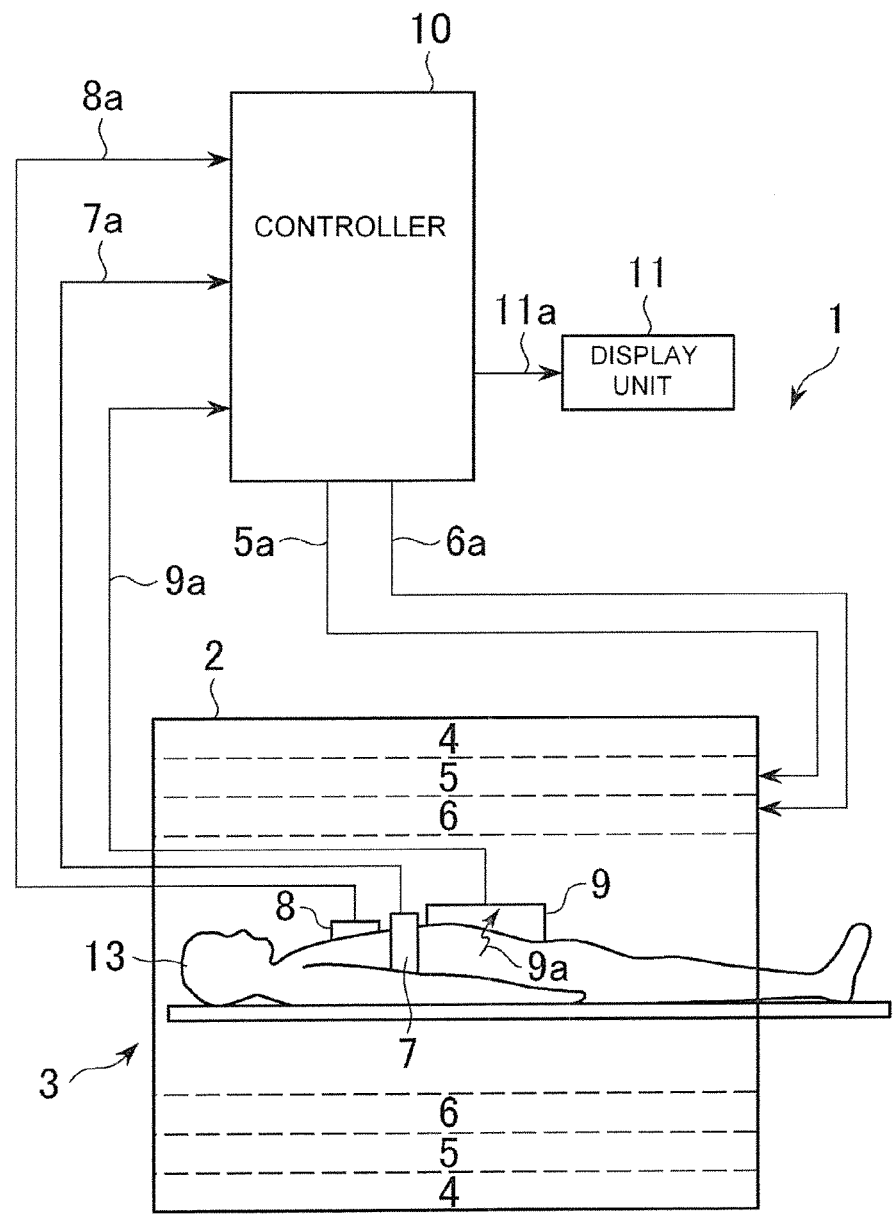
FIG. 1 is a block diagram of an exemplary MRI apparatus.

FIG. 1 is a block diagram of an MRI apparatus 1. The MRI apparatus 1 is one example of the best mode for carrying out the invention.

The MRI apparatus 1 has a magnet assembly 2. The magnet assembly 2 has a bore 3 for inserting a subject 13 therein. The magnet assembly 2 includes a static magnetic field generation device 4, a gradient coil 5 and a transmission coil 6.

The static magnetic field generation device 4 generates a predetermined static magnetic field to within the bore 3. The gradient coil 5 generates a gradient magnetic field within the bore 3. The transmission coil 6 transmits an RF pulse to within the bore 3.

The MRI apparatus 1 has a bellows 7 and a heartbeat sensor 8.

The bellows 7 detects the breathing of the subject 13 and transmits a breathing or respiratory signal 7a to a controller 10. The heartbeat sensor 8 detects the heartbeat of the subject 13 and transmits an electrocardiac signal 8a to the controller 10.

The controller 10 calculates a state of breathing of the subject 13 and a state of the heartbeat thereof, based on the respiratory signal 7a and the electrocardiac signal 8a and generates a gradient coil drive signal 5a for driving the gradient coil 5 and a transmission coil drive signal 6a for driving the transmission coil 6, based on the result of calculation. The gradient coil 5 applies a gradient pulse to the subject 13, based on the gradient coil drive signal 5a. The transmission coil 6 transmits a transmission pulse to the subject 13, based on the transmission coil drive signal 6a.

The MRI apparatus 1 also has a reception coil 9. The reception coil 9 receives an MR signal 9a from the subject 13. The received MR signal 9a is supplied to the controller 10.

The controller 10 reconstructs an image, based on the MR signal 9a sent from the reception coil 9 and generates an image signal 11a. A display unit 11 displays an image corresponding to the image signal 11a.

Figure 2:
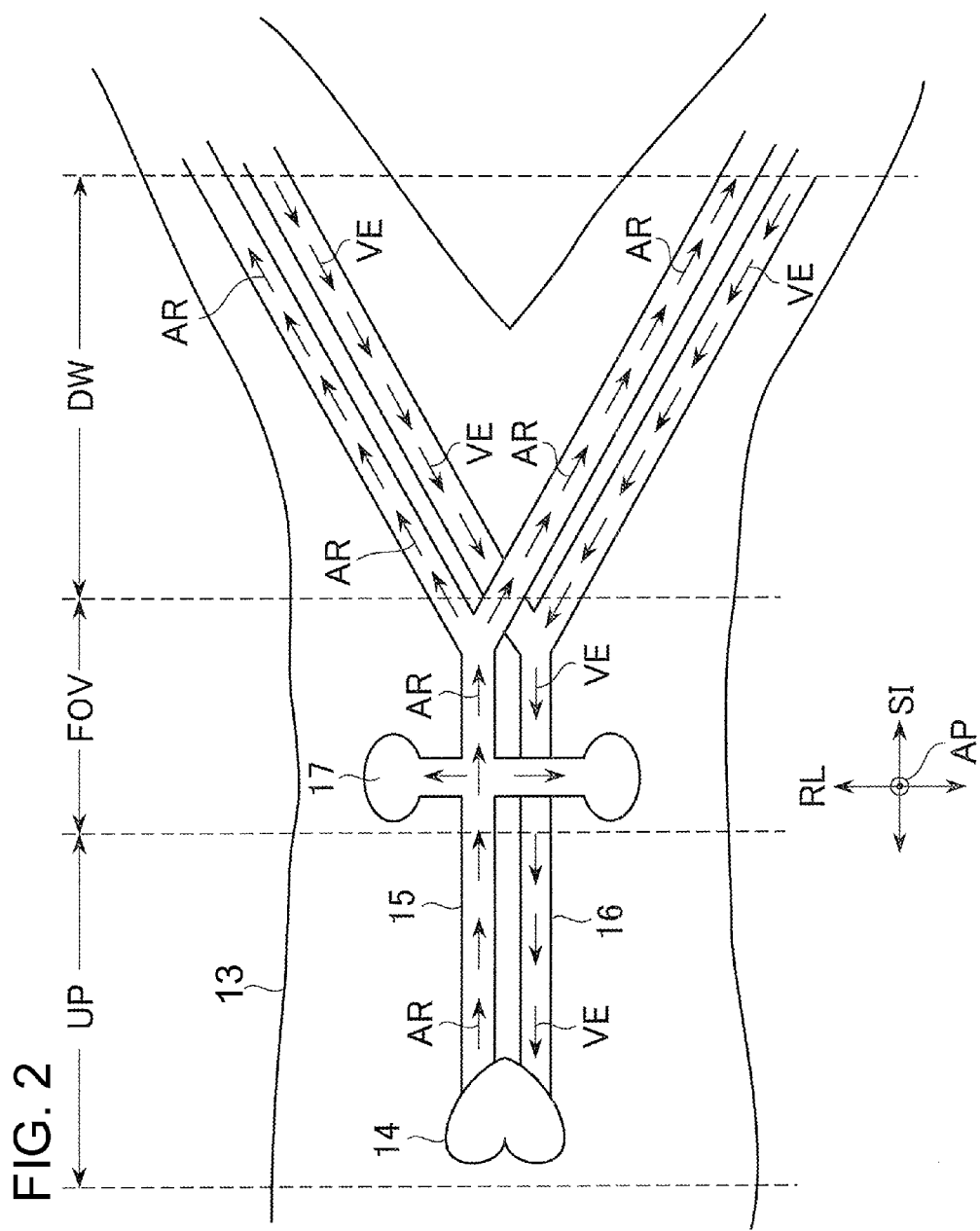
FIG. 2 is a diagram schematically showing a field of view of a subject.

FIG. 2 is a diagram schematically showing a field of view FOV of the subject 13.

An artery 15 and a vein 16 connected to the heart 14 of the subject 13 are shown in FIG. 2. Arterial blood AR flows from an upstream area UP to a downstream area DW via the field of view FOV. Venous blood VE flows from the downstream area DW to the upstream area UP via the field of view FOV contrary to the arterial blood AR. The present embodiment will explain a case in which an area containing the kidneys 17 is taken as the field of view FOV and an MR image of the artery blood AR flowing through the field of view FOV is acquired.

Incidentally, the field of view FOV contains a plurality of background tissues (such as kidneys 17, muscles, fat) untargeted for imaging, etc. in addition to the artery blood AR targeted for imaging. Since it is considered that the artery blood AR is extracted in the present embodiment, it is difficult to visually identify the bloodstream state of the artery blood AR where the background tissues untargeted for imaging are extracted together with the artery blood AR. It is thus necessary to avoid the extraction of such background tissues as much as possible. It is also necessary to reduce artifacts due to the body motion of the subject 13 where possible. Therefore, in the present embodiment, a pulse sequence is executed with the following timings where the artery blood AR is imaged.

FIGS. 3(a)-3(e) are diagrams for describing one example of a pulse sequence for imaging the artery blood AR and with which timing the pulse sequence should be executed.

FIG. 3(a) is a graph showing a respiratory waveform Wresp of the subject 13, FIG. 3(b) is a graph showing an electrocardiac waveform or electrocardiogram ECG of the subject 13, and FIG. 3(c) is a pulse sequence PS for imaging the artery blood AR.

A respiratory period or cycle of the subject 13 includes a period Tlarge large in body motion based on the breathing or respiration of the subject 13 and a period Tsmall small in body motion (refer to FIG. 3(a)). In the present embodiment, the pulse sequence PS is executed during the period Tsmall small in body motion based on the breathing of the subject 13 to reduce the body-motion artifacts due to the breathing of the subject 13.

Three pulse sequences 21, 22 and 23 are shown in the pulse sequence PS of FIG. 3(c).

The pulse sequence 21 is of a pulse sequence for causing the values of longitudinal magnetization components of a plurality of background tissues to differ from the value of a longitudinal magnetization component of the artery blood AR. Several examples illustrative of the pulse sequence 21 for executing such a longitudinal magnetization adjustment have been described in, for example, Japanese Unexamined Patent Publication No. 2007-190362. One of a plurality of longitudinal magnetization adjusting pulse sequences described in Japanese Unexamined Patent Publication No. 2007-190362 is shown in FIG. 3(d) as a longitudinal magnetization adjusting pulse sequence 21. The pulse sequence 21 has four types of RF pulses (45° RF pulse P45x_1, 180° RF pulse P180xy, −180° RF pulse P-180xy and 45° RF pulse P45x_2), a velocity encode gradient pulse Gv and a killer pulse Gk. The four types of RF pulses are of longitudinal magnetization adjusting RF pulses for making the absolute values of longitudinal magnetization components of a plurality of background tissues (such as the kidneys 17, muscles and fat) smaller than the absolute value of the magnetization component of the artery blood AR. Since the details of these pulses have been described in Japanese Unexamined Patent Publication No. 2007-190362, their detailed explanations will be omitted herein.

The longitudinal magnetization adjusting pulse sequence 21 is preferably executed during a systole period Tsy (refer to FIG. 3(b)). By executing the longitudinal magnetization adjusting pulse sequence 21 during the systole period Tsy, the longitudinal magnetization component of the artery blood AR can be more emphasized with respect to a longitudinal magnetization component of each static tissue. After the execution of the longitudinal magnetization adjusting pulse sequence 21, the longitudinal magnetization inverting pulse sequence 22 is executed.

The longitudinal magnetization inverting pulse sequence 22 is of a pulse sequence for inverting the longitudinal magnetization components of the artery blood AR and background tissues plural times. Although the longitudinal magnetization inverting pulse sequence 22 has two non-selective inversion pulses IR1 and IR2 in the present embodiment, selective inversion pulses may be used instead of the non-selective inversion pulses. The longitudinal magnetization inverting pulse sequence 22 may use three or more non-selective inversion pulses and/or selective inversion pulses. After the execution of the longitudinal magnetization inverting pulse sequence 22, the pulse sequence 23 for data acquisition is executed.

In the present embodiment, the data acquisition pulse sequence 23 is of a pulse sequence based on an SSFP (Steady-state free precession) method. As shown in FIG. 3(e), the data acquisition pulse sequence 23 has ramp-up RF pulses Pramp. Excitation pulses Pda for acquiring data from the subject 13 are provided after the ramp-up RF pulses Pramp. The data acquisition pulse sequence 23 is preferably executed during a diastole period Tdi (refer to FIG. 3(b)). Executing the data acquisition pulse sequence 23 during the diastole period Tdi makes it possible to reduce FLOW VOID.

A description will next be made of at which timing the two non-selective inversion RF pulses IR1 and IR2 of the longitudinal magnetization inverting pulse sequence 22 are transmitted.

Figure 4:
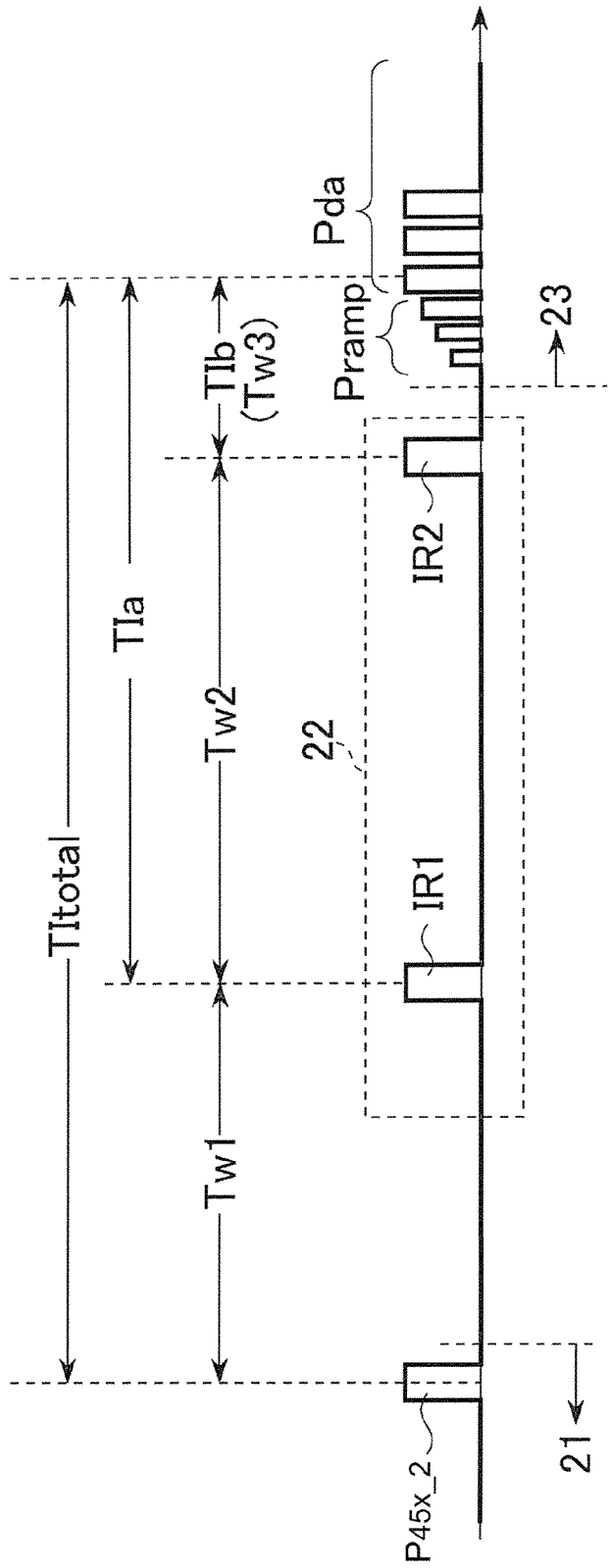
FIG. 4 is a diagram for describing timings provided to transmit two non-selective inversion pulses IR1 and IR2.

FIG. 4 is a diagram for describing timings provided to transmit the two non-selective inversion RF pulses IR1 and IR2.

While the longitudinal magnetization component of the body fluid (artery blood AR or the like) that flows in a longitudinal direction SI (refer to FIG. 2) can be sufficiently emphasized in the longitudinal magnetization adjusting pulse sequence 21 described in the Japanese Unexamined Patent Publication No. 2007-190362, the body fluid that flows in a latitudinal direction RL and a vertical direction AP (refer to FIG. 2) cannot be emphasized sufficiently. Therefore, a predetermined inversion time TItotal is provided between the longitudinal magnetization adjusting pulse sequence 21 and the data acquisition pulse sequence 23 to sufficiently distribute the body fluid whose longitudinal magnetization component has been emphasized with respect to the longitudinal direction SI, even in the latitudinal direction RL and the vertical direction AP (refer to FIG. 2).

A plurality of non-selective RF inversion pulses are transmitted during the inversion time TItotal. In the present embodiment, the two non-selective RF inversion pulses IR1 and IR2 are transmitted. The non-selective RF inversion pulse IR1 is transmitted when a first waiting time Tw1 has elapsed from the 45° RF pulse P45x_2 of the longitudinal magnetization adjusting pulse sequence 21. The non-selective RF inversion pulse IR2 is transmitted when a second waiting time Tw2 has elapsed from the non-selective RF inversion pulse IR1.

The first excitation pulse Pda of the data acquisition pulse sequence 23 is transmitted when a third waiting time Tw3 has elapsed from the non-selective RF inversion pulse IR2.

In FIG. 4, an inversion time between the 45° RF inversion pulse P45x_2 and the corresponding excitation pulse Pda is expressed in TItotal, an inversion time between the non-selective RF inversion pulse IR1 and the excitation pulse Pda is expressed in TIa, and an inversion time between the non-selective RF inversion pulse IR2 and the excitation pulse Pda is expressed in TIb, respectively. Thus, the waiting times Tw1, Tw2 and Tw3 can be expressed using the inversion times TItotal TIa and TIb as follows:

$$Tw1 = TItotal - TIa \quad \text{Eq. (1)}$$

$$Tw2 = TIa - TIb \quad \text{Eq. (2)}$$

$$Tw3 = TIb \quad \text{Eq. (3)}$$

In the present embodiment, the first, second and third waiting times Tw1, Tw2 and Tw3 are set so as to meet the following relations with respect to the inversion time TItotal:

$$Tw1/TItotal = 0.35 \quad \text{Eq. (4)}$$

$$Tw2/TItotal = 0.5 \quad \text{Eq. (5)}$$

$$Tw3/TItotal = 0.15 \quad \text{Eq. (6)}$$

In order to execute the pulse sequences 21, 22 and 23 shown in FIG. 3, the controller 10 is configured as shown below.

Figure 5:
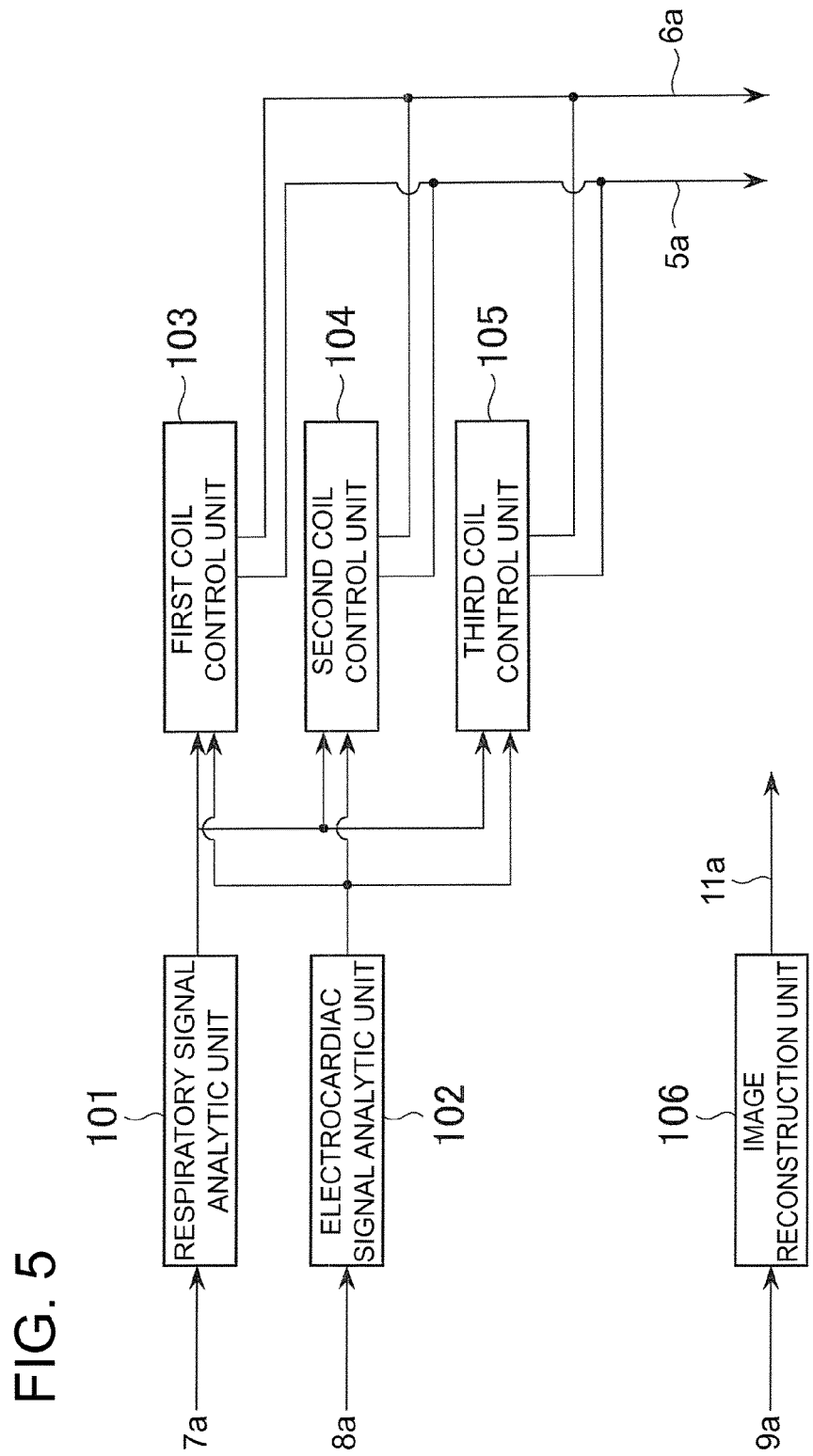
FIG. 5 is one example of a functional block diagram of a controller that may be used with the MRI apparatus shown in FIG. 1.

FIG. 5 is one example of a functional block diagram of the controller 10.

The controller 10 has a respiratory signal analytic unit 101, an electrocardiac signal analytic unit 102, a first coil control unit 103, a second coil control unit 104, a third coil control unit 105, and an image reconstruction unit 106.

The respiratory signal analytic unit 101 calculates a period Tlarge large in body motion due to the breathing of the subject 13 and a period Tsmall small in body motion due to the breathing thereof from the respiratory signal 7a.

The electrocardiac signal analytic unit 102 calculates a systole period Tsy of the subject 13 and a diastole period Tdi thereof from the electrocardiac signal 8a.

Figure 3:
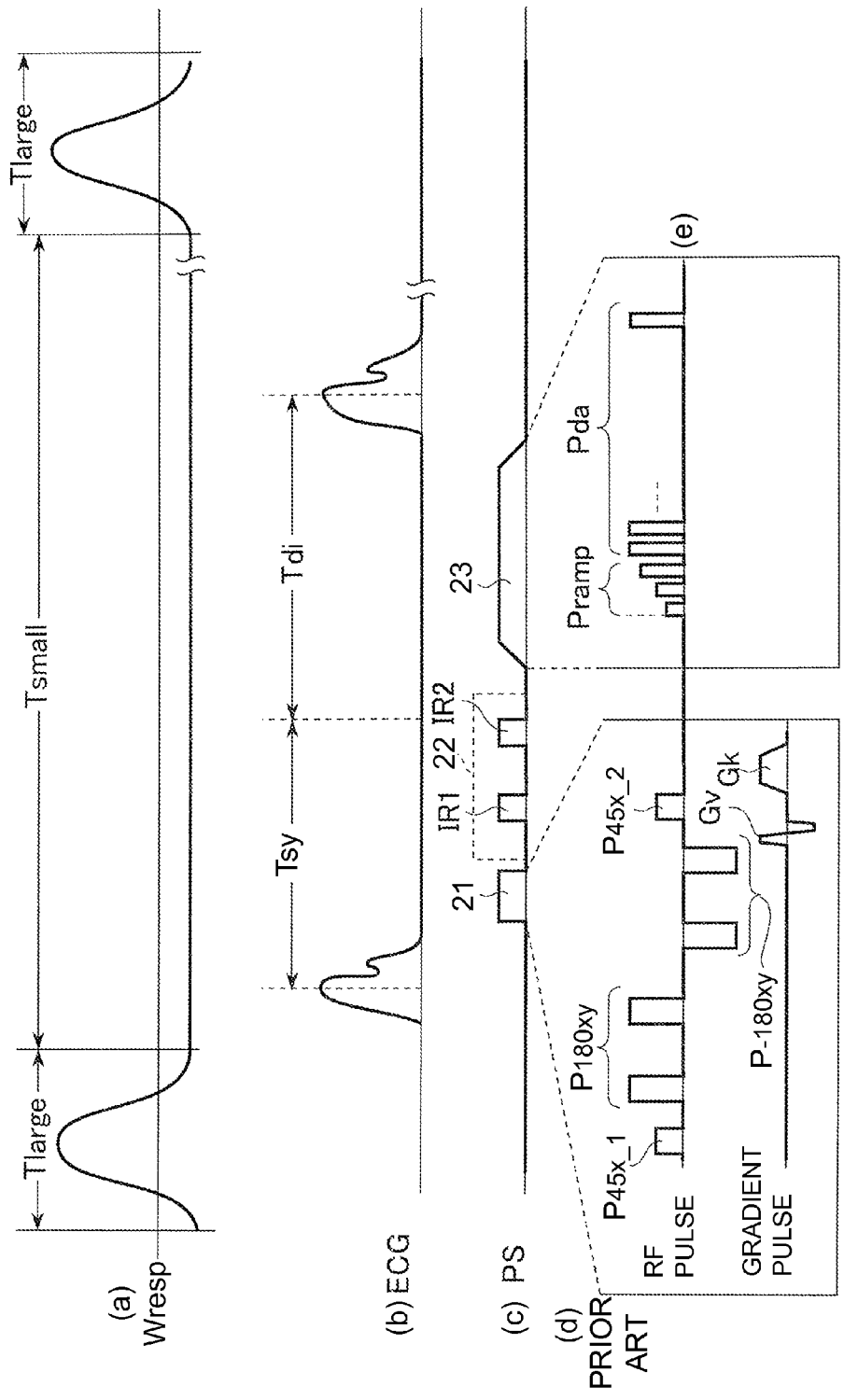
FIG. 3 is a diagram for describing one example of a pulse sequence for imaging arterial blood and in which timing the pulse sequence is executed.

The first coil control unit 103 controls the transmission coil 6 and the gradient coil 5 in such a manner that the longitudinal magnetization adjusting pulse sequence 21 is executed during the period Tsmall small in body motion due to the breathing and the systole period Tsy (refer to FIG. 3).

The second coin control unit 104 controls the transmission coil 6 and the gradient coil 5 in such a manner that after the execution of the longitudinal magnetization adjusting pulse sequence 21, the longitudinal magnetization inverting pulse sequence 22 is carried out before the data acquisition pulse sequence 23 is executed. The second coil control unit 104 controls the transmission coil 6 and the gradient coil 5 in such a manner that the longitudinal magnetization inverting pulse sequence 22 is executed during the period Tsmall small in body motion due to the breathing.

The third coil control unit 105 controls the transmission coil 6 and the gradient coil 5 in such a manner that the data acquisition pulse sequence 23 is executed after the execution of the longitudinal magnetization inverting pulse sequence 22. The third coil control unit 105 also controls the transmission coil 6 and the gradient coil 5 in such a manner that the data acquisition pulse sequence 23 is executed during the period Tsmall small in body motion due to the breathing and the diastole period Tdi. Further, the third coil control unit 105 controls the transmission coil 6 in such a manner that a plurality of excitation pulses Pda are transmitted from the transmission coil 6 during a period in which the magnetization component Mz of the artery blood AR that flows through the field of view FOV is larger than the magnetization components Mz of the plural background tissues (such as the kidneys 17, muscles, fat).

The image reconstruction unit 11a reconstructs an image, based on the MR signal 9a and generates an image signal 11a.

A description will next be made of what processing is executed by the MRI apparatus 1.

Figure 6:
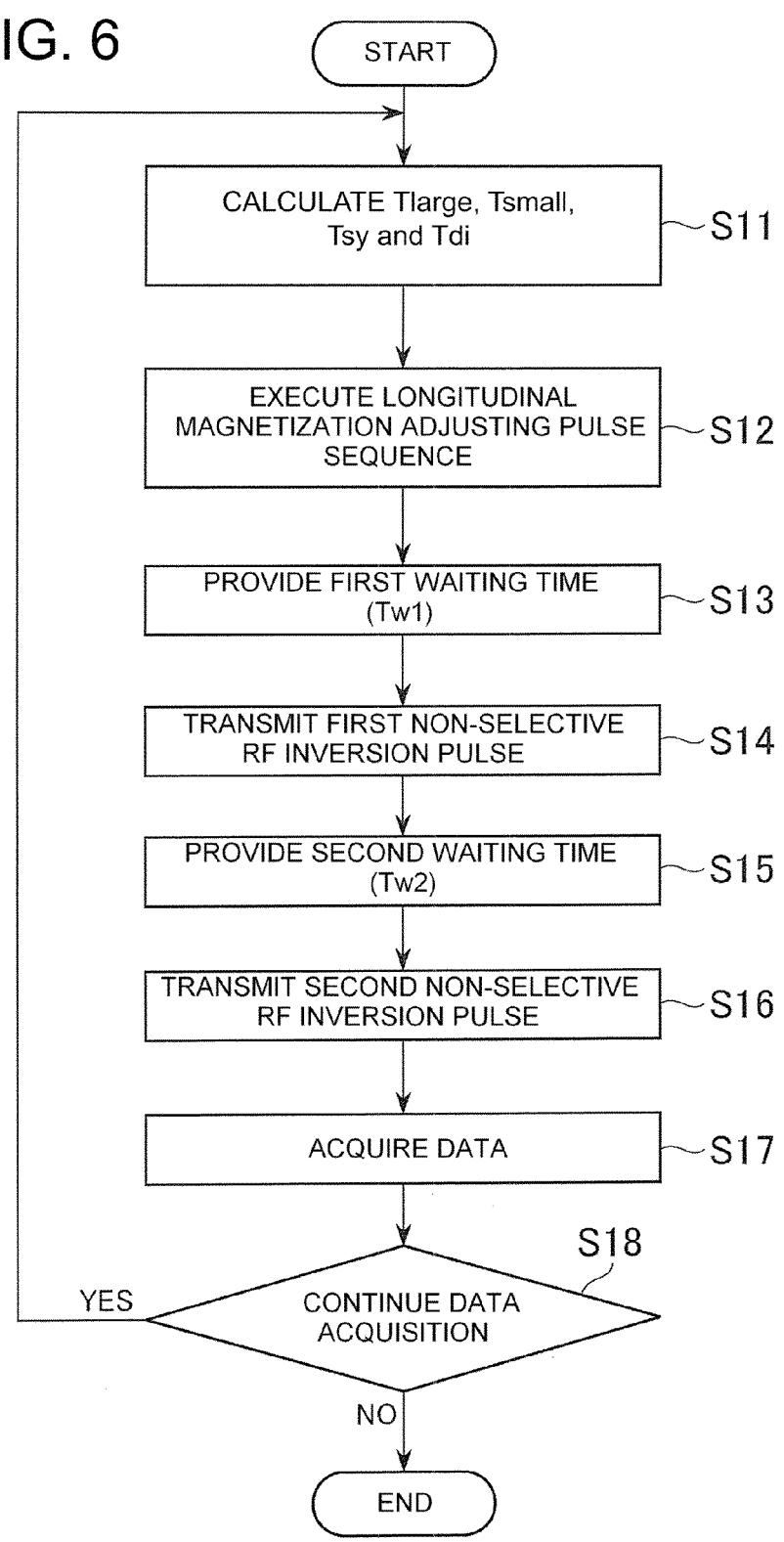
FIG. 6 is a diagram showing a processing flow of the MRI apparatus shown in FIG. 1.

FIG. 6 is a diagram showing a processing flow of the MRI apparatus 1.

At Step S11, the respiratory signal analytic unit 101 first calculates a period Tlarge large in body motion and a period Tsmall small in body motion. The electrocardiac signal analytic unit 102 calculates a systole period Tsy and a diastole period Tdi. The timings provided to execute the pulse sequences 21, 22 and 23 (refer to FIG. 3) are determined from the result of calculation referred to above. After Step S11, the processing flow proceeds to Step S12.

At Step S12, the first coil control unit 103 executes the longitudinal magnetization adjusting pulse sequence 21 (refer to FIG. 3(c)).

At Step S13, a first waiting time Tw1 is provided by the second coil control unit 104 from the time when a 45° RF pulse P45x_2 (refer to FIG. 3(c)) is transmitted.

At Step S14, the second coil control unit 104 transmits a non-selective RF inversion pulse IR1 when the first waiting time Tw1 has elapsed.

At Step S15, a second waiting time Tw2 is provided by the second coil control unit 104 from the time when the non-selective RF inversion pulse IR1 is transmitted.

At Step S16, the second coil control unit 104 transmits a non-selective RF inversion pulse IR2 when the second waiting time Tw2 has elapsed.

At Step S17, the third coil control unit 105 executes the data acquisition pulse sequence 23 to perform data acquisition of the artery blood AR.

At Step S18, it is further determined whether the acquisition of data should be continued. When the data acquisition is continued, the processing flow returns to Step S11. When it is determined at Step S18 that the data acquisition is not continued, the loop is terminated.

Figure 7:
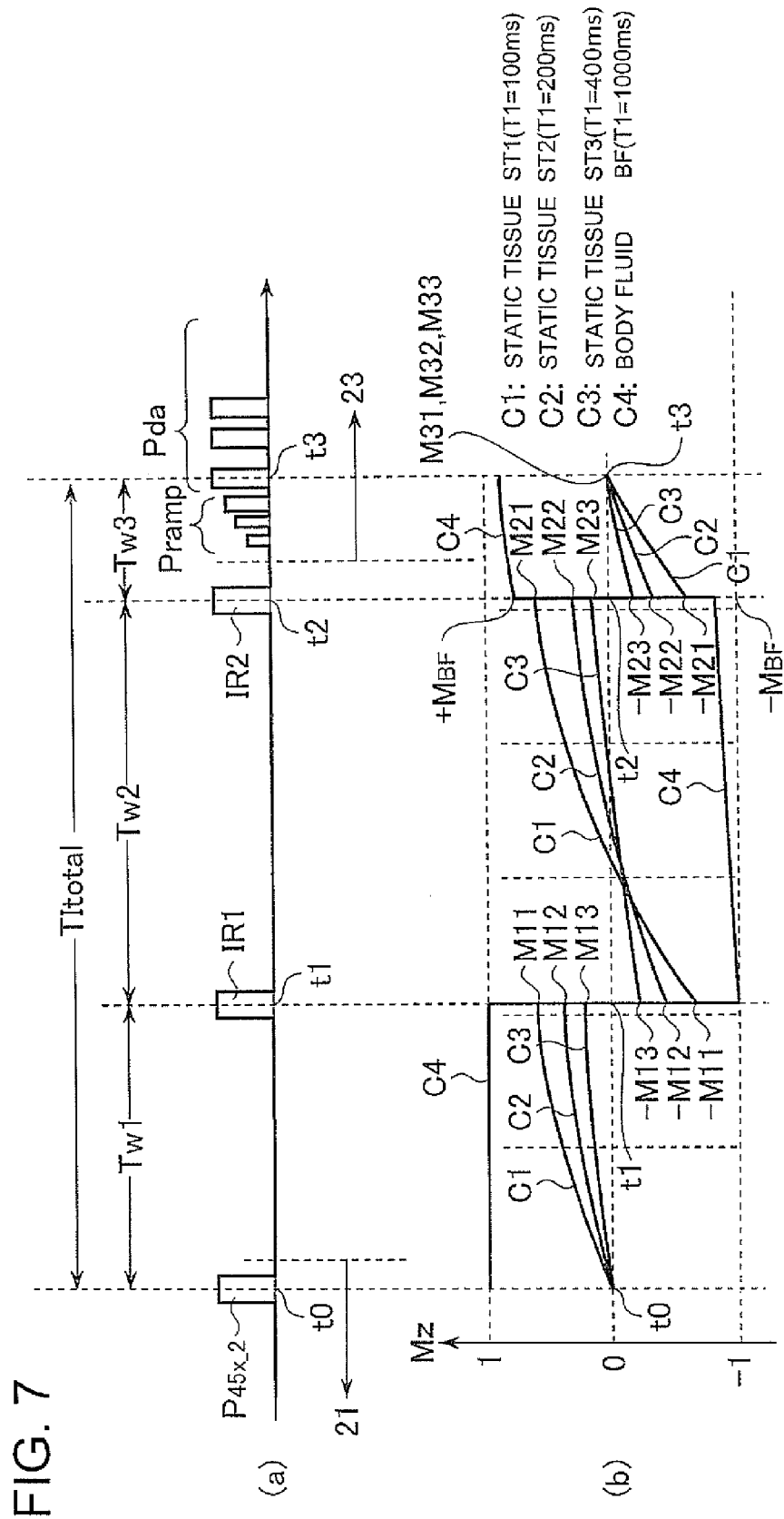
FIG. 7 shows the RF pulses shown in FIG. 4 and two longitudinal magnetization recovery curves.

In the present embodiment, the imaging of the artery blood AR in accordance with the flow of FIG. 6 makes it possible to draw or create the body fluid (artery blood AR, for example) that flows within the subject 13 at high velocity, emphatically to a sufficient degree as compared with the body fluid (venous blood VE, for example) that flows within the subject 13 at low velocity and the static tissues (muscles and fat, for example). This reason will be explained below with reference to FIG. 7.

FIGS. 7(a) and 7(b) show the RF pulses shown in FIG. 4 and two longitudinal magnetization recovery curves.

FIG. 7(a) illustrates the RF pulses of FIG. 4. FIG. 7(b) shows fourth longitudinal magnetization recovery curves C1 through C4 at the time that simulations are performed as to how the longitudinal magnetization components change where the RR pulses of FIG. 7(a) are transmitted to tissues having T1 values different from one another.

The longitudinal magnetization recovery curves C1 through C3 are of longitudinal magnetization recovery curves of three static tissues ST1, ST2 an ST3. The longitudinal magnetization recovery curve C4 is of a longitudinal magnetization curve of body fluid BF that flows within the subject at a predetermined velocity.

Simulation conditions (S1) through (S4) are as follows:

(S1) The static tissues ST1, ST2 and ST3 become zero in longitudinal magnetization component Mz at a time t0 by execution of the longitudinal magnetization adjusting pulse sequence 21.

(S2) The body fluid BF becomes Mz=1 in longitudinal magnetization component Mz at the time t0 by execution of the longitudinal magnetization adjusting pulse sequence 21.

(S3) The following values are adopted as the T1 values of the static tissues ST1, ST2 and ST3 and the body fluid BF.

T1 value of static tissue ST1=100 ms

T1 value of static tissue ST2=200 ms

T1 value of static tissue ST3=400 ms

T1 value of body fluid BF=1000 ms (S4) Inversion time TItotal=300 ms. Accordingly, the first, second and third waiting times Tw1, Tw2 and Tw3 are given from the equations (4) through (6) as follows:

Tw1=105 ms

Tw2=150 ms

Tw3=45 ms

The longitudinal magnetization recovery curves C1 through C4 will be explained below.

As to the longitudinal magnetization recovery curves C1, C2 and C3, the longitudinal magnetization components Mz of the static tissues ST1, ST2 and ST3 are Mz=0 at the time t0 (refer to the simulation condition (S1)).

When the first waiting time Tw1 has elapsed from the time t0 (time t1), the longitudinal magnetization components Mz of the static tissues ST1, ST2 and ST3 are respectively recovered to M11, M12 and M13. Since the T1 values of the static tissues ST1, ST2 and ST3 are respectively 100 ms, 200 ms and 400 ms, M11, M12 and M13 satisfy the following relation.

$$M11>M12>M13 \qquad \text{Eq. (7)}$$

When the longitudinal magnetization components Mz of the static tissues ST1, ST2 and ST3 are respectively recovered to M11, M12 and M13 (time t1), the non-selective inversion RF pulse IR1 is transmitted. Thus, the longitudinal magnetization component Mz of the static tissues ST1, ST2 and ST3 are respectively inverted to -M11, -M12 and -M13.

At the time t1, the longitudinal magnetization components Mz of the static tissues ST1, ST2 and ST3, which have been inverted to the negative values at the time t1, are advanced in longitudinal relaxation again from the time t1. When the second waiting time Tw2 has elapsed from the time t1 (time t2), the longitudinal magnetization components Mz of the static tissues ST1, ST2, ST3 are recovered to their corresponding M21, M22 and M23. M21, M22 and M23 satisfy the following relation.

$$M21>M22>M23>0 \qquad \text{Eq. (8)}$$

Thus, any of the longitudinal magnetization components Mz of the static tissues ST1, ST2 and ST3 is recovered to a position value at the time t2.

When the longitudinal magnetization components Mz of the static tissues ST1, ST2 and ST3 are respectively recovered to M21, M22 and M23 (time t2), the non-selective inversion RF pulse IR2 is transmitted. Accordingly, the longitudinal magnetization components Mz of the static tissues ST1, ST2 and ST3 are respectively inverted to -M21, -M22 and -M23.

The longitudinal magnetization components Mz of the static tissues ST1, ST2 and ST3, which have been inverted to the negative values at the time t2, are advanced in longitudinal relaxation again. When the third waiting time Tw3 has elapsed from the time t2 (time t3), the longitudinal magnetization components Mz of the static tissues ST1, ST2 and ST3 are respectively recovered to M31, M32 and M33. M31, M32 and M33 satisfy the following relation.

$$-0.1<M31, M32, M33<0.1 \qquad \text{Eq. (9)}$$

Accordingly, the longitudinal magnetization component Mz of the static tissues ST1, ST2 and ST3 respectively become a value substantially near zero at the data acquisition start time t3.

As to the longitudinal magnetization recovery curve C4, the longitudinal magnetization component Mz of the body fluid BF is Mz=1 at the time t0 (refer to the simulation condition (S2)). Thus, the longitudinal magnetization component Mz of the body fluid BF remains at Mz=1 until the non-selective inversion RF pulse IR1 is transmitted.

When the first waiting time Tw1 has elapsed (time t1), the non-selective inversion RF pulse IR1 is transmitted. Thus, the longitudinal magnetization component Mz of the body fluid BF is inverted to Mz=-1.

The longitudinal magnetization component Mz of the body fluid BF, which has been inverted to the negative value, is advanced in longitudinal relaxation at the time t1. At the time t2, the longitudinal magnetization component Mz of the body fluid BF is brought to -MBF. Since the T1 value of the body fluid BF is 1000 ms (refer to the simulation condition (S3)), it is sufficiently longer than the second waiting time Tw2=150 ms (refer to the simulation condition (S4)). Thus, even when the second waiting time Tw2 has elapsed, the longitudinal magnetization component Mz=−MBF of the body fluid BF can be expressed in the following equation:

$$-MBF \cong -1 \qquad \text{Eq. (10)}$$

Since the non-selective inversion RF pulse IR2 is transmitted at the time t2, the longitudinal magnetization component Mz of the body fluid BF is inverted from −MBF to +MBF. Since −MBF has a value sufficiently close to "−1" (refer to the equation (10)), MBF can be expressed in the following equation:

$$+MBF \cong +1 \qquad \text{Eq. (11)}$$

The longitudinal magnetization component Mz of the body fluid BF, which has been inverted to the positive value at the time t2, is advanced in longitudinal relaxation again. Since MBF is of a value sufficiently close to "1" at the time t2, the longitudinal magnetization component Mz of the body fluid BF is substantially brought to "1" when the third waiting time Tw3 has elapsed from the time t2 (time t3). Accordingly, the longitudinal magnetization component Mz of the body fluid BF is Mz≅1 at the data acquisition start time t3.

While the longitudinal magnetization component Mz of the body fluid BF is Mz≅1 at the data acquisition start time t3 as described above, the longitudinal magnetization components Mz of the static tissues ST1, ST2 and ST3 are Mz≅0 respectively. It is thus understood that the body fluid BF is emphasized at the data acquisition start time t3 by acquiring data, and an MR image in which the static tissues ST1, ST2 and ST3 have been suppressed, is obtained. In the above description, the T1 values of the static tissues ST1, ST2 and ST3 are respectively 100 ms, 200 ms and 400 ms. Generally, however, even in the case of a static tissue having a T1 value smaller than 100 ms and a static tissue having a T1 value larger than 400 ms, the longitudinal magnetization component Mz at the data acquisition start time t3 can be made nearly zero. If the body fluid (such as venous blood) that flows within the subject at a sufficiently low velocity is taken even in the case of the body fluid that flows within the subject, then the longitudinal magnetization component Mz at the time t0 becomes a value close to zero. It is therefore possible to cause the longitudinal magnetization component Mz at the data acquisition start time t3 to approach zero.

Thus, although the body fluid that flows through the subject 13 at high velocity is emphasized by starting the acquisition of data at the data acquisition start time t3, an MR image in which each static tissue and the body fluid that flows within the subject at a sufficient low velocity can be obtained. In the present embodiment, the following values are considered as the T1 values of the body fluid and each static tissue contained in the field of view FOV (refer to FIG. 2) of the subject.

FIG. 8 shows the general values of the T1 values of the body fluid and static tissues contained in the field of view FOV.

The field of view FOV contains background tissues (such as fat, kidneys 14, liver, muscles, intestinal substance, etc.) undesired to be drawn or created in addition to the artery blood AR desired to be emphasized and created. One smallest in T1 value, of the background tissues is an intestinal substance, and one largest in T1 value thereof is moisture. According to the present embodiment, although the T1 values of the background tissues range widely in this way, the longitudinal magnetization components Mz of these background tissues can be brought as close to zero as possible at the data acquisition start time t3, and an MR image emphasized in artery blood AR can be obtained.

Incidentally, the relation of the equation (5), i.e., the relation of Tw2/TItotal=0.5 exists between the waiting time Tw2 and the inversion time TItotal in the present embodiment. Thus, the waiting time Tw2 is equal to one half of the inversion time TItotal. When the relation of Tw2/TItotal=0.5 is established, the longitudinal magnetic components of a plurality of background tissues can be brought close to a null point at the data acquisition start time t3 even though the T1 values of the background tissues vary over a wide range (range from 0 ms to 200 ms, for example). Thus, the waiting time Tw2 and the inversion time TItotal are preferably set in such a manner that the relation of Tw2/TItotal=0.5 is established. If the longitudinal magnetization component of the artery blood AR can be made enough larger than the longitudinal magnetization components of the background tissues at the time t3, it is not always necessary to take Tw2/TItotal=0.5. The value of Tw2/TItotal may be larger or smaller than 0.5. Since, however, it is difficult to cause the longitudinal magnetization component of each background tissue large in T1 value to approach the null point where the value of Tw2/TItotal is excessively smaller or larger than 0.5, the value of Tw2/TItotal is preferably set to a value close to 0.5.

When the value of Tw2/TItotal is set to 0.5 as in the present embodiment, it is desirable that Tw3/TItotal satisfies the following equation:

$$0.15 \leq Tw3/TItotal \leq 0.25 \qquad (12)$$

In the present embodiment, Tw3/TItotal is set equal to 0.15 so as to satisfy the equation (12) (refer to the equation (6)). Setting the third waiting time Tw3 so as to satisfy the equation (12) makes it possible to bring the longitudinal magnetization components of the plural background tissues close to the null point at the time t3 even though the T1 values of the background tissues (such as the kidneys 17, muscles, fat) vary greatly. This reason will be explained below with reference to FIGS. 9 through 11.

Figure 9:
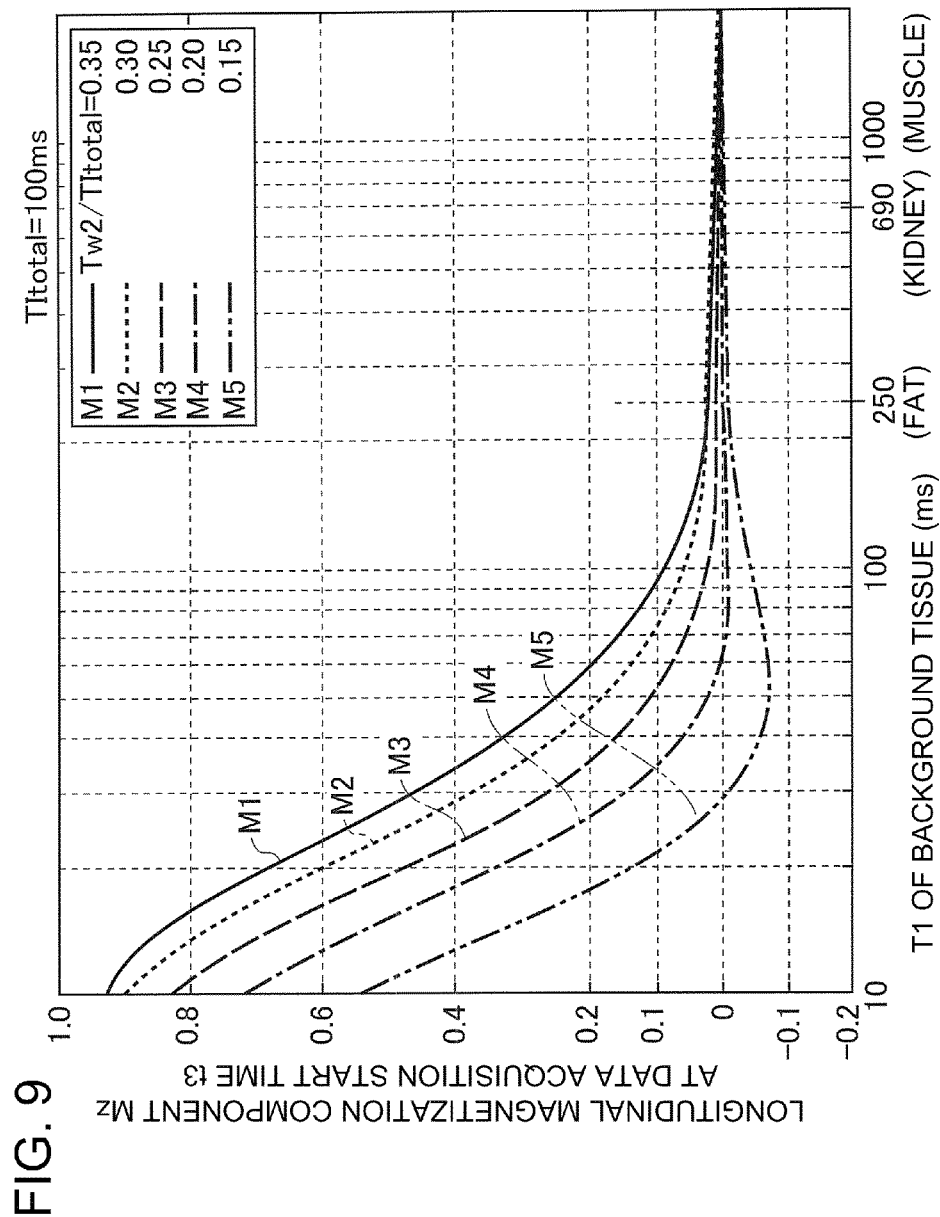
FIG. 9 is a graph showing a result of calculation by simulation as to how the value of a longitudinal magnetization component at a time t3 changes according to a T1 value of a background tissue.
Figure 10:
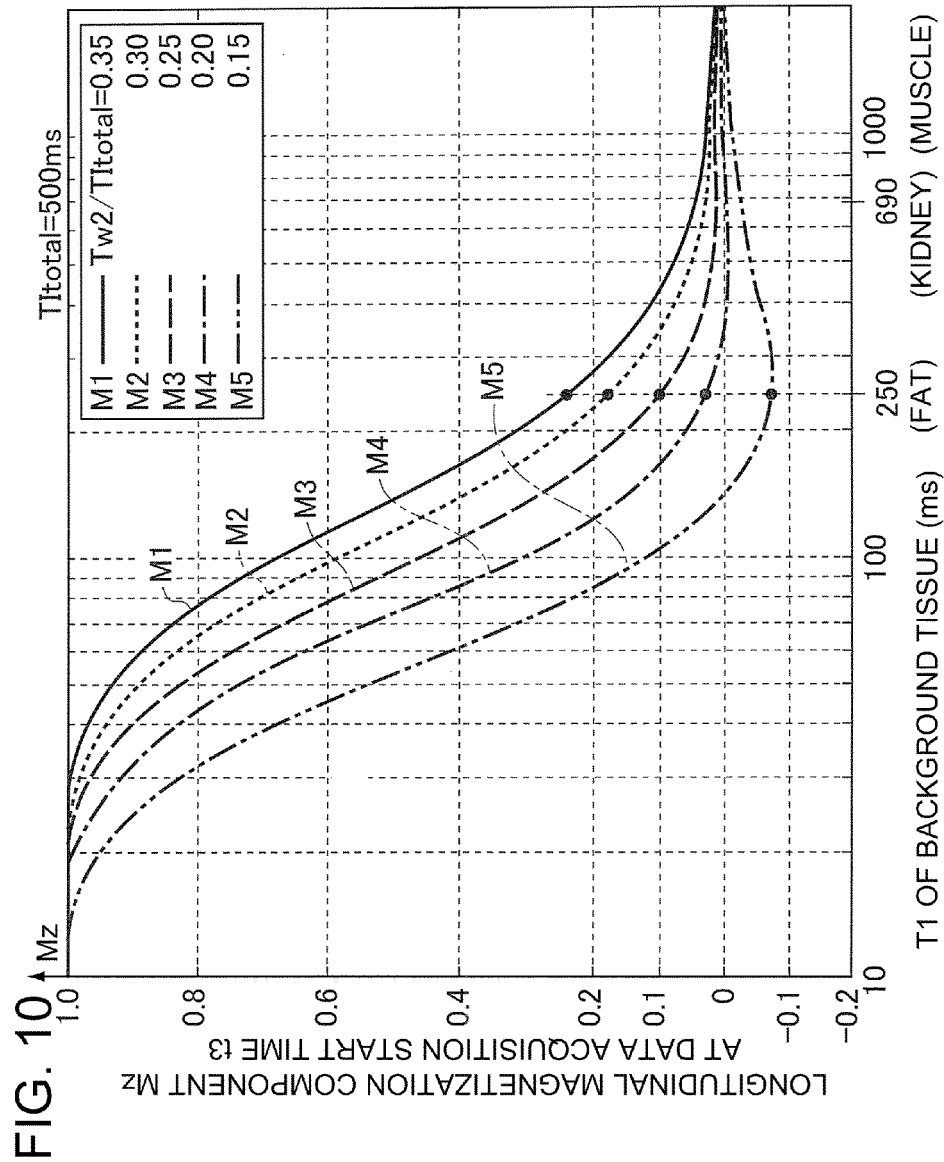
FIG. 10 is a graph illustrating a result of calculation by simulation as to how the value of the longitudinal magnetization component at the time t3 changes according to a T1 value of a background tissue.
Figure 11:
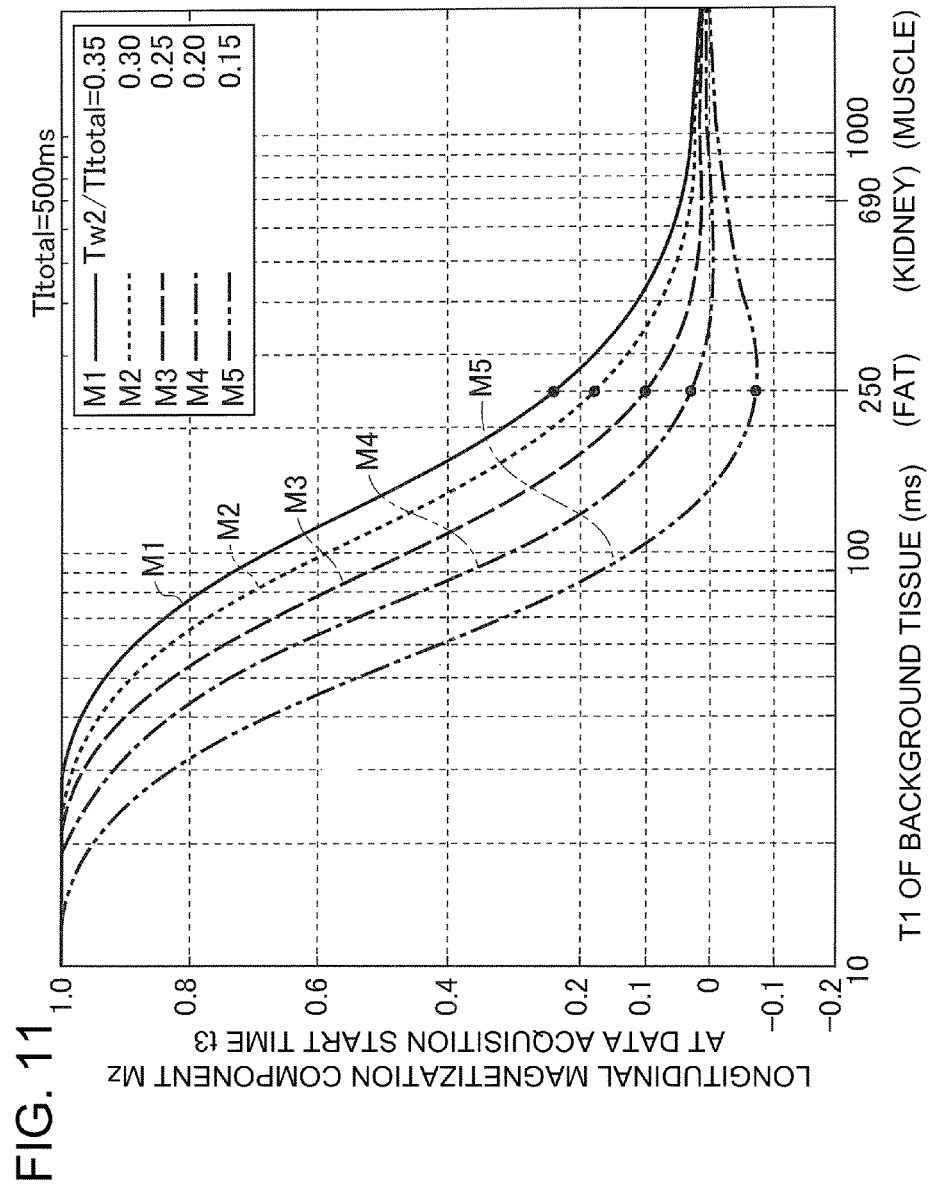
FIG. 11 is a graph showing a result of calculation by simulation as to how the value of longitudinal magnetization component at the time t3 changes according to a T1 value of a background tissue.

FIGS. 9 through 11 are respectively graphs showing results of calculations by simulations as to how the values of the longitudinal magnetization components Mz at the data acquisition start time t3 change according to the T1 values of the background tissues.

The horizontal axis of each graph indicates the T1 value of each background tissue, and the vertical axis thereof indicates the longitudinal magnetization component Mz of the background tissue at the data acquisition start time t3. T1 values of the fat, kidney and muscle are typically illustrated in the horizontal axis of the graph as the T1 values of the background tissues. Simulation results are represented by five curves or curved lines M1 through M5 respectively. The curves M1 through M5 respectively indicate simulation results where the value of Tw3/TItotal is set to 0.35, 0.30, 025, 0.20 and 0.15. Incidentally, FIG. 9 is TItotal=100 ms, FIG. 10 is TItotal=300 ms, and FIG. 11 is TItotal=500 ms, respectively.

It is understood that referring to FIG. 9, the longitudinal magnetization components Mz of the fat, kidneys and muscle fall within a range of −0.1<Mz<0.1 regardless of the value of Tw3/TItotal and are sufficiently close to the null point. Referring to FIG. 10, the longitudinal magnetization components Mz of the fat, kidney and muscle at the data acquisition time t3 fall within the range of −0.1<Mz<0.1 if Tw3/TItotal=0.15, 0.20, 0.25 or 0.30. Eventually, the longitudinal magnetization components Mz are sufficiently close to the null point. Referring further to FIG. 11, the longitudinal magnetization components Mz of the fat, kidney and muscle at the data acquisition time t3 fall within the range of −0.1<Mz<0.1 if Tw3/TItotal=0.15, 0.20 or 0.25. Eventually, the longitudinal magnetization components Mz are sufficiently close to the null point.

It is thus understood from FIGS. 9 through 11 that if Tw3/TItotal=0.15, 0.20 or 0.25, then the longitudinal magnetization components Mz of the fat, kidney and muscle at the data acquisition time t3 sufficiently approach the null point regardless of the value of TItotal. From the above consideration, Tw3/TItotal is preferably within the range of 0.15 to 0.25. Incidentally, if the longitudinal magnetization component of the artery blood AR can be made sufficiently larger than the longitudinal magnetization component of each background tissue at the data acquisition start time t3, it is then not always necessary to contain Tw3/TItotal in the range of 0.15 to 0.25.

Although the pulse sequence shown in FIG. 3 has been used as the longitudinal magnetization adjusting pulse sequence 21 in the present embodiment, other pulse sequences may be used if the magnitude of the longitudinal magnetization component can be adjusted according to the flow rate of each tissue.

Although the longitudinal magnetization inverting pulse sequence 22 has the two RF inversion pulses IR1 and IR2 in the present embodiment, it may include three or more RF inversion pulses. There is however a fear that when the number of the RF inversion pulses is odd, the acquisition of data is performed while the longitudinal magnetization component Mz of the artery blood AR targeted for imaging is recovered from the negative value to the null point in the form of longitudinal magnetization, so that the strength of an MR signal for the artery blood AR becomes small. Thus, if it is desired to increase the strength of the MR signal for the artery blood AR, then the number of the RF inversion pulses may preferably be even. Incidentally, if the artery blood AR can be created sufficiently, then the number of the RF inversion pulses may be odd.

Although the longitudinal magnetization inverting pulse sequence 22 has the two non-selective inversion pulses IR1 and IR2 in the present embodiment, the selective inversion pulses may be used instead of the non-selective inversion pulses. The longitudinal magnetization inverting pulse sequence 22 may use three or more non-selective inversion pulses and/or selective inversion pulses.

Although the data acquisition pulse sequence 23 is of the pulse sequence using the SSFP method, another pulse sequence (for example, pulse sequence using an FSE method) may be used.

In the present embodiment, the artery blood AR has been created or drawn. However, it is also possible to create or draw vein blood VE and cerebral fluid and suppress the artery blood AR by using the invention.

In the present embodiment, the timings provided to execute the pulse sequences 21, 22 and 23 (refer to FIG. 3) are calculated based on the respiratory signal 7a and the electrocardiac signal 8a. However, the timings provided to execute the pulse sequences 21, 22 and 23 may be calculated using only one of the respiratory signal 7a and the electrocardiac signal 8a. It is also possible to execute the pulse sequences 21, 22 and 23 without using the respiratory signal 7a and the electrocardiac signal 8a.

Although the TItotal has been set to 300 ms in the present embodiment, other values may be adopted.

In the present embodiment, the longitudinal magnetization component Mz of the artery blood AR has been set to Mz≅1 and the longitudinal magnetization component Mz of each background tissue has been set to Mz≅0 at the data acquisition start time t3. If, however, the artery blood AR can be created emphatically, it is then also possible to set the longitudinal magnetization component Mz of the artery blood AR to Mz≅−1 and set the longitudinal magnetization component Mz of each background tissue to Mz≅0, for example.

Many widely different embodiments of the invention may be configured without departing from the spirit and the scope of the present invention. It should be understood that the present invention is not limited to the specific embodiments described in the specification, except as defined in the appended claims.

What is claimed is:

1. A Magnetic Resonance Imaging (MRI) apparatus configured to image a subject such that a body fluid that flows into an imaging area of the subject is emphasized over a plurality of background tissues existing in the imaging area, said MRI apparatus comprising:
a transmission coil configured to transmit a Radio Frequency (RF) pulse to the subject;
a gradient coil configured to apply a gradient pulse to the subject; and
a controller including a first coil control device, a second coil control device, and a third coil control device,
the first coil control device configured to cause said transmission coil and said gradient coil to execute a first pulse sequence that causes values of longitudinal magnetization components of the background tissues to become zero and causes a value of a longitudinal magnetization component of the body fluid to become a positive value,
the second coil control device configured to cause said transmission coil and said gradient coil to execute a second pulse sequence that inverts the longitudinal magnetization components of the body fluid and the background tissues, said second coil control device configured to execute the second pulse sequence a plurality of times after the execution of the first pulse sequence and cause said transmission coil to transmit a plurality of non-selective inversion pulses a plurality of times to invert the longitudinal magnetization components of the body fluid and the background tissues,
the third coil control device configured to cause said transmission coil and said gradient coil to execute a third pulse sequence for acquiring each Magnetic Resonance (MR) signal of the body fluid after the execution of the second pulse sequence, wherein said third coil control device is further configured to cause said transmission coil to transmit an excitation pulse while an absolute value of the longitudinal magnetization component of the body fluid is larger than an absolute value of each of the longitudinal magnetization components of the background tissues.

2. The MRI apparatus according to claim 1, wherein said second coil control device is configured to cause said transmission coil to transmit an even number of inversion pulses in order to invert the longitudinal magnetization components of the body fluid and the background tissues, the inversion pulses transmitted an even number of times.

3. The MRI apparatus according to claim 2, wherein said second coil control device is configured to cause said transmission coil to transmit two inversion pulses in order to invert twice the longitudinal magnetization components of the body fluid and the background tissues.

4. The MRI apparatus according to claim 3, wherein the first inversion pulse of the two inversion pulses is an inversion pulse for inverting the longitudinal magnetization components of the body fluid and the background tissues from a positive value to a negative value, and wherein the second inversion pulse of the two inversion pulses is an inversion pulse for inverting the longitudinal magnetization components of the body fluid and the background tissues from the negative value to a value larger than zero by longitudinal relaxation.

5. The MRI apparatus according to claim 1, further comprising a heartbeat sensor configured to detect a heartbeat of the subject and to output an electrocardiac signal.

6. The MRI apparatus according to claim 5, wherein the controller further comprises an electrocardiac signal analytic device configured to analyze the electrocardiac signal and to determine a systole period of the subject and a diastole period of the subject.

7. The MRI apparatus according to claim 6, wherein said first coil control device is configured to cause said transmission coil to transmit a longitudinal magnetization adjusting RF pulse to make the absolute values of the longitudinal magnetization components of the background tissues smaller than the absolute value of the longitudinal magnetization component of the body fluid during the systole period.

8. The MRI apparatus according to claim 7, wherein said third coil control device is configured to cause said transmission coil to transmit the excitation pulse during the diastole period.

9. The MRI apparatus according to claim 8, wherein said second coil control device is configured to cause said transmission coil to transmit the first inversion pulse and the second inversion pulse after the longitudinal magnetization adjusting RF pulse has been transmitted during the systole period and before the excitation pulse is transmitted during the diastole period.

10. The MRI apparatus according to claim 9, wherein said second coil control device is configured to cause said transmission coil to transmit the first inversion pulse when a first waiting time has elapsed after the transmission of the longitudinal magnetization adjusting RF pulse.

11. The MRI apparatus according to claim 10, wherein said second coil control device is configured to cause said transmission coil to transmit the second inversion pulse when a second waiting time has elapsed after the transmission of the first inversion pulse.

12. The MRI apparatus according to claim 11, wherein said third coil control device is configured to cause said transmission coil to transmit the excitation pulse when a third waiting time has elapsed after the transmission of the second inversion pulse.

13. The MRI apparatus according to claim 12, wherein the second waiting time is half of a time interval between the longitudinal magnetization adjusting RF pulse and the excitation pulse.

14. The MRI apparatus according to claim 13, wherein when the time interval between the longitudinal magnetization adjusting RF pulse and the excitation pulse is TItotal and the third waiting time is Tw3, Tw3/TItotal satisfies the following equation:

$$0.15 < Tw3/TItotal < 0.25.$$

15. The MRI apparatus according to claim 1, further comprising a breathing detecting device configured to detect breathing of the subject and to output a respiratory signal, wherein the breathing detecting device comprises a bellows.

16. The MRI apparatus according to claim 15, wherein the controller further comprises a respiratory signal analytic device configured to analyze the respiratory signal and to determine a time period that is based on body motion of the subject to the breathing of the subject.

17. The MRI apparatus according to claim 16,
wherein said first coil control device is configured to cause said transmission coil and said gradient coil to execute the first pulse sequence during the determined time period,
wherein said second coil control device is configured to cause said transmission coil and said gradient coil to execute the second pulse sequence during the determined time period, and
wherein said third coil control device is configured to cause said transmission coil and said gradient coil to execute the third pulse sequence during the determined time period.

18. The MRI apparatus according to claim 1, wherein the body fluid is artery blood, and wherein the background tissues are at least two of fat, a kidney, a liver, muscles, an intestinal substance, and venous blood.

* * * * *